US008422136B2

(12) United States Patent
Hasegawa

(10) Patent No.: US 8,422,136 B2
(45) Date of Patent: Apr. 16, 2013

(54) ELECTRONIC ELEMENT WAFER MODULE; ELECTRONIC ELEMENT MODULE; SENSOR WAFER MODULE; SENSOR MODULE; LENS ARRAY PLATE; MANUFACTURING METHOD FOR THE SENSOR MODULE; AND ELECTRONIC INFORMATION DEVICE

(75) Inventor: Masahiro Hasegawa, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 768 days.

(21) Appl. No.: 12/316,057

(22) Filed: Dec. 9, 2008

(65) Prior Publication Data

US 2009/0174947 A1 Jul. 9, 2009

(30) Foreign Application Priority Data

Dec. 13, 2007 (JP) .................................. 2007-322626
Dec. 13, 2007 (JP) .................................. 2007-322627

(51) Int. Cl.
*G02B 27/10* (2006.01)

(52) U.S. Cl.
USPC ............................ 359/619; 359/620; 359/621

(58) Field of Classification Search .......... 359/619–623, 359/642, 811–824; 438/7–113; 351/619–623, 351/642, 811–824; 348/7–113; 250/201.9, 250/299, 300
See application file for complete search history.

(56) References Cited

U.S. PATENT DOCUMENTS

| 5,060,526 | A | * | 10/1991 | Barth et al. ................. 73/862.59 |
| 5,536,455 | A | * | 7/1996 | Aoyama et al. ................. 264/1.7 |
| 6,049,430 | A | | 4/2000 | Heanue et al. ................. 359/642 |
| 6,096,155 | A | | 8/2000 | Harden et al. ................. 156/50 |
| 6,129,613 | A | * | 10/2000 | Bothra ............................. 451/66 |
| 6,373,635 | B1 | * | 4/2002 | Fujimoto et al. ............. 359/619 |
| 6,771,351 | B2 | * | 8/2004 | Kubo ............................... 355/55 |
| 6,812,725 | B2 | * | 11/2004 | Udo et al. ................. 324/754.03 |
| 6,955,394 | B1 | * | 10/2005 | Reddig et al. ................. 296/208 |
| 6,955,934 | B2 | * | 10/2005 | Gallup et al. ................... 438/27 |
| 7,224,856 | B2 | | 5/2007 | Kathman et al. ................ 385/14 |
| 7,456,483 | B2 | | 11/2008 | Tsukamoto et al. .......... 257/433 |
| 7,826,153 | B2 | * | 11/2010 | Hong ............................. 359/797 |
| 7,923,793 | B2 | * | 4/2011 | Choi et al. .................... 257/415 |
| 2005/0237415 | A1 | | 10/2005 | Kong et al. .................... 348/335 |
| 2009/0294779 | A1 | * | 12/2009 | Ida et al. .......................... 257/82 |

FOREIGN PATENT DOCUMENTS

| JP | 2003-277085 | 10/2003 |
| JP | 2005-322809 | 11/2005 |
| JP | 2007-129164 | 5/2007 |
| KR | 10-2005-0103366 | 10/2005 |

OTHER PUBLICATIONS

Notice of Submission of Argument, Korean Intellectual Property Office, Jul. 14, 2010 in connection with patent application No. 10-2008-0116790, (English translation).
Korean Office Action dated Jul. 14, 2010.

* cited by examiner

*Primary Examiner* — Mohammed Hasan
(74) *Attorney, Agent, or Firm* — Edwards Wildman Palmer LLP; George W. Neuner

(57) ABSTRACT

An electronic element wafer module is provided, comprising: an electronic element wafer arranged with a plurality of electronic elements having a through hole electrode; a resin adhesion layer formed in a predetermined area on the electronic element wafer; a transparent cover member covering the electronic element wafer and fixed on the resin adhesion layer; and a plurality of resin optical elements adhered and fixed on the transparent cover member to be integrated in such a manner to correspond to the respective plurality of electronic elements.

58 Claims, 10 Drawing Sheets

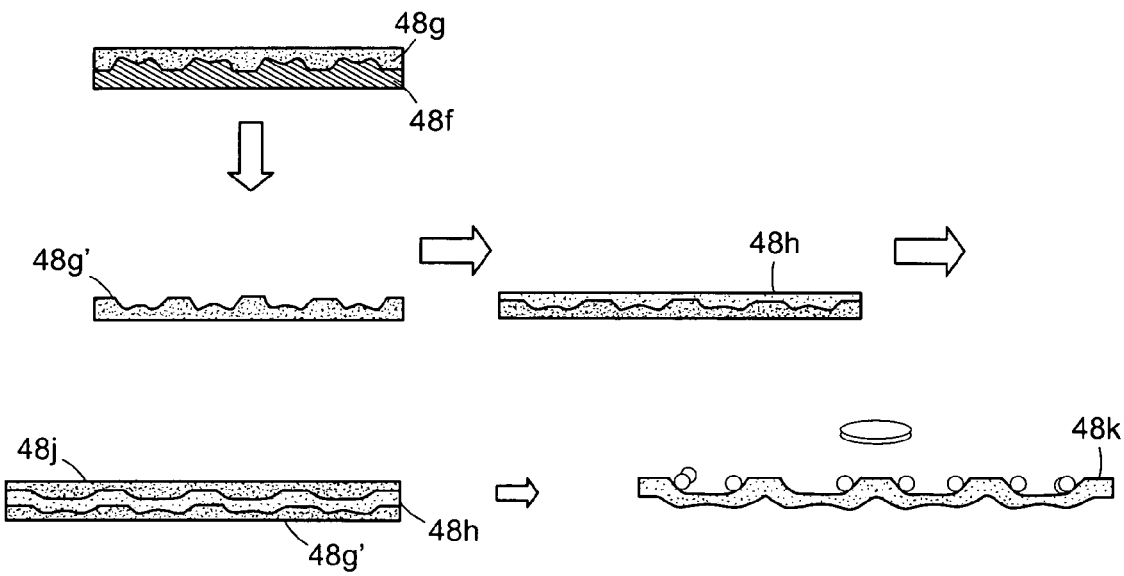
FIG. 16
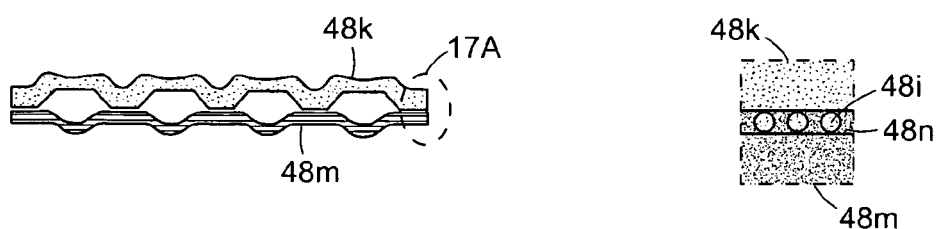
FIG. 17
FIG. 17A

ELECTRONIC ELEMENT WAFER MODULE; ELECTRONIC ELEMENT MODULE; SENSOR WAFER MODULE; SENSOR MODULE; LENS ARRAY PLATE; MANUFACTURING METHOD FOR THE SENSOR MODULE; AND ELECTRONIC INFORMATION DEVICE

This nonprovisional application claims priority under 35 U.S.C. §119(a) to Patent Application No. 2007-322626 filed in Japan on Dec. 13, 2007, and Patent Application No. 2007-322627 filed in Japan on Dec. 13, 2007, the entire contents of which are hereby incorporated by reference.

BACKGROUND OF THE INVENTION

1. Field of the Invention

The present invention relates to an electronic element wafer module, an electronic wafer module, a sensor wafer module, a sensor module and a manufacturing method of the sensor module, a lens array plate, and an electronic information device. The electronic element wafer module is formed by modularizing (integrating) a plurality of lenses for focusing incident light and an image capturing element that corresponds to each lens and has a plurality of light receiving sections for performing photoelectric conversions on and capturing image light from a subject, or by modularizing (integrating) a plurality of optical function elements for advancing outgoing light straight, and bending and guiding incident light in a predetermined direction, with an emission element for corresponding to each optical function element and generating outgoing light, and a light receiving element for receiving incident light. The electronic element module is manufactured by cutting the electronic element wafer module. The sensor wafer module is formed by modularizing (integrating) the image capturing element having a plurality of light receiving sections for performing photoelectric conversions on and capturing image light from a subject, and a lens for forming incident light into an image on an image capturing element. The sensor module is formed by cutting the sensor wafer module. The lens array plate is used for the sensor module. The electronic information device includes, for example, a digital camera (e.g., digital video camera and digital still camera), an image input camera (e.g., car-mounted camera), a scanner, a facsimile machine, a camera-equipped cell phone device, and a personal digital assistant (PDA) having the sensor module as an image input device used in an image capturing section, or a pickup apparatus using the electronic element module in an information recording and reproducing section.

2. Description of the Related Art

A conventional sensor module of this type, which functions as an electronic element module, is used for a camera equipped cellular phone device and a personal digital assistant (PDA), and further a card camera and the like, as a camera module. Such a sensor module is provided with a solid-state image capturing chip and a holder member. The solid-state image capturing chip has an image capturing element, which functions as an electronic element, having a plurality of light receiving sections, for performing photoelectric conversions on and capturing image light from a subject, and the holder member for fixing a focusing lens for forming incident light into an image on an image capturing element, both of which are provided on a mount substrate, composed of ceramics, glass containing epoxy resin, and the like. In such a case, the solid-state image capturing chip is positioned on the mount substrate and wire bonding is performed. In addition, it is important to accurately fix the image-forming distance between the focusing lens and the image capturing element to precisely form incident light into an image on the image capturing element, so that a clear image can be obtained.

Next, US patent Reference 1 proposes a practical example of a conventional electronic element module 100 as illustrated in FIG. 19. The electronic element module 100 is configured as a pickup apparatus. A mount substrate 102 mounts an optical electronic element 101, which is an emission element as well as a light receiving element, then a spacer substrate 103 for securing a space is laminated on the mount substrate 102, and a seal substrate 105 provided with an optical function element 104 is successively laminated on the spacer substrate 103. The optical electronic element 101 has a configuration in which a wiring contact 106 is pulled out to the outside of the seal. The spacer substrate 103 has a form that includes a slope surface 107 inside. The slope surface 107 is coated with a reflection film. The optical function element 104 has an optical function such as outputting light from an emission element straight to the outside, and bending and guiding reflecting light that includes information from an optical disc and the like. A plurality of electronic element modules 100 can be manufactured at once by cutting the electronic element wafer module, in which the mount substrate 102, the spacer substrate 103, and the seal substrate 105 are laminated.

In addition, according to US patent Reference 2, as illustrated in FIG. 20, a base substrate 204 having a lens 203 formed thereon is aligned above a base substrate 202 having a lens 201 formed thereon, and the base substrate 204 and the base substrate 202 are vertically laminated and adhered by a adhesion layer 205 to form a multistage lens module 200 integratedly. In addition, according to US patent Reference 3, as illustrated in FIG. 21, a base substrate 304 is aligned via a spacer 303 above a base substrate 302 having a plurality of lenses 301 formed thereon, and the base substrate 304 and the base substrate 302 are vertically laminated and adhered with a adhesion resin to form a lens module 300 integratedly. US patent Reference 3 proposes a method for cutting this integrated lens module 300 at a cut position 305 so as to manufacture each lens module at once.

According to Reference 4, a plurality of glass optical elements (lenses) include a lens section that is formed by press molding softened glass with an upper mold and a lower mold, a tubular leg section curved and extended downwards from its circumference edge of the lens section at the press molding, and a flat plate section curved outwardly and extended horizontally from the tubular leg section, for coupling with another tubular leg section of a lens section. A sheet member, in which the plurality of glass optical elements are integrated, is adhered to a cover glass on a substrate having a plurality of image sensors provided thereon in such a manner that each image sensor corresponds to each lens section. Such a sheet member is cut for each image sensor.

According to Non-patent Reference 1, it is disclosed that a through hole is provided in a silicon wafer and a wafer front surface and a wafer back surface are electrically connected to each other via the through hole.

Reference 1: U.S. Pat. No. 7,224,856 B2 (FIG. 1)
Reference 2: U.S. Pat. No. 6,049,430
Reference 3: U.S. Pat. No. 6,096,155
Reference 4: Japanese Laid-Open Publication No. 2003-277085
Non-patent Reference 1: the 2004 International Conference on Solid State Devices and Materials, Tokyo, 2004, pp. 276-277 "Application of Hight Reliable Silicon Thru-Via to Image Sensor CSP"

SUMMARY OF THE INVENTION

However, if the mount substrate is used in the conventional technique of Reference 1 described above, the height of the module increases. In addition, a member for the mount substrate itself is required and the man-hours for the manufacturing increases. Further, not only an installing apparatus, but also the man-hours for installing the apparatus are required for installing the optical element on the mount substrate, thereby increasing the manufacturing cost.

Moreover, the conventional References 2 and 3 discuss a method for forming a focusing lens on a base substrate. Because the method uses a base substrate, such a base substrate itself is required. Due to the base substrate, the height of the module increases. In addition, a member for the base substrate itself is required and the man-hours for the manufacturing increases. Further, not only an installing apparatus but also the man-hours for installing are required for installing the optical element on the mount substrate, thereby increasing the manufacturing cost. Thus, by using the base substrate, the thickness of the focusing lens substrate influences its optical design, thereby extending the optical length. Further, although the conventional Reference 3 uses a spacer to secure a space for a focusing lens between base substrates, a man-hour is required not only for the process of the spacer itself but also the assembly of the spacer to be inserted between the base substrates, thereby increasing the manufacturing cost.

Further, although a method exists for forming a focusing lens by the etch back of a base substrate, this method produces a lens shape of a poor precision. Further, although the conventional Reference 4 forms a plurality of lens sections by press molding softened glass from top and bottom, this method produces a lens shape of a poor precision, and therefore, an accurate lens function cannot be obtained. Further, because this method press molds such softened glass from the top and bottom, high temperature and high pressure are required. In addition, if the temperature of the glass drops rapidly from its high temperature to its low temperature, the glass may be cracked, and therefore, the processing of the lens is not precise.

Further, according to the conventional Non-patent Reference 1, a through hole is provided so that a wafer front surface and a wafer back surface are electrically connected to each other via the through hole. By using the through hole, wire bonding will not be required between a sensor chip and a mount substrate. However, such a configuration alone will not allow for obtaining a plurality of modules having good precision and quality at once by cutting a sensor wafer module, which is an electronic element wafer module having a lens attached at a wafer level.

The present invention is intended to solve the conventional problems described above. The objective of the present invention is to provide an electronic element wafer module, which does not require a conventional mount substrate, base substrate or a spacer, reduces the man-hours for the manufacture of the module and the man-hour required for installing elements and the spacer, reduces the height of each module and provides good precision and quality. The further objective of the present invention is to provide an electronic element module that is made by cutting the electronic element wafer module, a sensor wafer module, a sensor module that is made by cutting the sensor wafer module and a manufacturing method for the sensor module, a lens array plate used for the sensor module, and an electronic information device using the electronic element module in an image capturing section or an information recording and reproducing section as an image input device.

An electronic element wafer module according to the present invention includes: an electronic element wafer arranged with a plurality of electronic elements having a through hole electrode; a resin adhesion layer formed in a predetermined area on the electronic element wafer; a transparent cover member covering the electronic element wafer and fixed on the resin adhesion layer; and a plurality of resin optical elements adhered and fixed on the transparent cover member to be integrated in such a manner to correspond to the respective plurality of electronic elements, thereby achieving the objective described above.

Preferably, the resin adhesion layer in the electronic element wafer module according to the present invention is formed to be in a half-sealed state on the circumference of each of the plurality of electronic elements of the electronic element wafer. That is, the electronic element wafer module according to the present invention includes: an electronic element wafer arranged with a plurality of electronic elements having a through hole electrode; a resin adhesion layer formed in a half-sealed state on the circumference of each of the plurality of electronic element of the electronic element wafer; a transparent cover member covering the electronic element wafer and fixed on the resin adhesion layer; and a plurality of optical elements mounted to be adhered and fixed on the transparent cover member in such a manner to correspond to the respective plurality of electronic elements, thereby achieving the objective described above. Still preferably, the plurality of optical elements in the electronic element wafer module according to the present invention is formed by being integrated. Further, the electronic element wafer module according to the present invention an electronic element wafer arranged with a plurality of electronic elements having a through hole electrode; a resin adhesion layer formed in a half-sealed state on the circumference of each of the plurality of electronic element of the electronic element wafer; and a transparent cover member covering the electronic element wafer and fixed on the resin adhesion layer, thereby achieving the objective described above.

Still preferably, in an electronic element wafer module according to the present invention, the plurality of optical elements are laminated with adhesion layers interposed in between the optical elements on the circumference side of the center portion in a plan view.

Still preferably, in an electronic element wafer module according to the present invention, the adhesion layer for adhering the optical element also has a light shielding function.

Still preferably, in an electronic element wafer module according to the present invention, a solid for determining a space is included in the adhesion layer for adhering the optical element.

Still preferably, in an electronic element wafer module according to the present invention, the optical element is composed of one or more lenses.

Still preferably, in an electronic element wafer module according to the present invention, the lens is provided with a lens area at the center portion and provided with a spacer section having a predetermined thickness on the circumference side of the lens area.

Still preferably, in an electronic element wafer module according to the present invention, the lens is a focusing lens.

Still preferably, in an electronic element wafer module according to the present invention, the lens is an aberration correcting lens, diffusion lens and a focusing lens, and a spacer section having a predetermined thickness and provided on the circumference side of each of the lenses is laminated in this order of aberration correcting lens, diffusion lens and a focusing lens.

Still preferably, in an electronic element wafer module according to the present invention, the spacer section has a position determining function.

Still preferably, in an electronic element wafer module according to the present invention, the position determining function of the spacer section is constituted with a concave portion and a convex portion with a taper or an alignment mark.

Still preferably, in an electronic element wafer module according to the present invention, the optical element is an optical function element for advancing outgoing light straight, and bending incident light to allow for entering in a predetermined direction.

Still preferably, in an electronic element wafer module according to the present invention, the resin adhesion layer has a groove formed to communicate with the space portion above each of the plurality of electronic elements to the outside.

Still preferably, in an electronic element wafer module according to the present invention, the resin adhesion layer has a groove formed to communicate with the outside via another space portion communicating with the space portion above each of the plurality of electronic elements by a groove.

Still preferably, in an electronic element wafer module according to the present invention, the resin adhesion layer is positioned for each of the plurality of electronic elements and is also positioned in an area other than the area of the electronic element as well as an area other than a dicing area between adjacent electronic elements.

Still preferably, in an electronic element wafer module according to the present invention, the groove is formed in a diagonal straight line, an S shape or a maze shape in relation to an edge direction of a quadrilateral of the resin adhesion layer in a plan view.

Still preferably, in an electronic element wafer module according to the present invention, the resin adhesion layer has a material configuration that is materialistically communicatable with the inside.

Still preferably, in an electronic element wafer module according to the present invention, the transparent cover member is a transparent resin plate or a glass plate.

Still preferably, in an electronic element wafer module according to the present invention, the transparent cover member is provided with IR (Infra-Red) coating or AR (Anti-Reflection) coating on the surface.

Still preferably, in an electronic element wafer module according to the present invention, the electronic element has an image capturing element having a plurality of light receiving sections for performing photoelectric conversions on and capturing image light from a subject.

Still preferably, in an electronic element wafer module according to the present invention, the electronic element has an emission element for generating outgoing light, and a light receiving element for receiving incident light.

An electronic element module according to the present invention is cut into individual or multiple groupings from the electronic element wafer module according to the present invention, thereby achieving the objective described above.

Preferably, in an electronic element module according to the present invention, a cut side of the electronic element module either has a light shielding function or is provided with a light shielding function.

A sensor wafer module according to the present invention includes: a sensor wafer arranged with a plurality of sensor chip sections having a through hole electrode; a resin adhesion layer formed in a predetermined area on the sensor wafer; a transparent cover member covering the sensor wafer and fixed on the resin adhesion layer; and a plurality of resin focusing lens array plates mounted to be adhered and fixed on the transparent cover member in such a manner to correspond to the respective plurality of image capturing elements, wherein each of the plurality of sensor chip sections is provided with an image capturing element having a plurality of light receiving sections for performing photoelectric conversions on and capturing image light from a subject, thereby achieving the objective described above. Further, a sensor wafer module according to the present invention includes: a sensor wafer arranged with a plurality of sensor chip sections having a through hole electrode; a resin adhesion layer formed in a half-sealed state on the circumference of each of the plurality of electronic elements of the sensor wafer; a transparent cover member covering the sensor wafer and fixed on the resin adhesion layer; and a plurality of focusing lenses mounted to be adhered and fixed on the transparent cover member in such a manner to correspond to the respective plurality of electronic elements, wherein the sensor chip section is provided with an image capturing element having a plurality of light receiving sections for performing photoelectric conversions on and capturing image light from a subject, as the electronic element, thereby achieving the objective described above.

A sensor module according to the present invention is cut into individual or multiple groupings from the sensor wafer module according to the present invention.

A method for manufacturing a sensor module according to the present invention includes the steps of: forming a resin adhesion layer on each circumference of a plurality of image capturing elements arranged with a plurality of sensor chips; adhering a cover glass on the resin adhesion layer; forming a plurality of through holes penetrating from a back surface to a front surface of the sensor wafer reaching up to a back surface of a pad, for each sensor chip; forming a wiring on the back surface of the sensor wafer via the through hole; adhering one or more resin lens plates on the surface of the cover glass at a spacer section on the circumference side of a lens area of each resin lens plate; cutting the sensor wafer, the cover glass, and the lens at once for one or more sensor chip sections; and forming a light shielding layer on at least a cut section, thereby achieving the objective described above. Further, a method for manufacturing a sensor module according to the present invention includes the steps of: forming a resin adhesion layer in a half-sealed state on each circumference of a plurality of image capturing elements of a sensor wafer arranged with a plurality of sensor chip sections; adhering a cover glass on the resin adhesion layer; thinning a back side of the sensor wafer; forming a plurality of through holes penetrating from a back surface to a front surface of the sensor wafer reaching up to a back surface of a pad, for each sensor chip section; forming a wiring on the back surface of the sensor wafer via the through hole; adhering one or more lens plates on the surface of the cover glass; cutting the sensor wafer, the cover glass, and the lens at once for one or more sensor chip sections; and forming a light shielding layer on at least a cut section, thereby achieving the objective described above.

Preferably, in a method for manufacturing a sensor module according to the present invention, the step of cutting uses laser or a wire saw.

An electronic information device according to the present invention uses an electronic element module cut from the electronic element wafer module according to the present invention, as a sensor module in an image capturing section, thereby achieving the objective described above.

An electronic information device according to the present invention uses an electronic element module cut from the electronic element wafer module according to claim 23, in an information recording and reproducing section, thereby achieving the objective described above.

A lens array plate in a sheet form according to the present invention includes a plurality of lenses each provided with a lens area in the center portion and provided with a spacer section having a predetermined thickness on the circumference side of the lens area, the plurality of lenses integrated in a matrix, thereby achieving the objective described above.

The functions of the present invention having the structures described above will be described hereinafter.

An element substrate (electronic element chip section) having an electronic element formed thereon and a wiring substrate of a conventional mount substrate are shared and a through hole is made penetrating the element substrate from a front surface to a back surface so as to form a wiring, so that such a conventional mount substrate will not be required. In addition, a conventional base substrate is not used. Instead, a focusing lens is used, the focusing lens being precisely formed by a technique of resin molding to resin mold a lens, for example, which functions as an optical element. As a result, a spacer section (edge section) on the circumference side of the focusing lens can accurately secure a space.

As described above, the conventional mount substrate for installing an electronic element chip section by wire bonding is no longer required, so that the man-hours for the manufacturing of the substrate itself and the man-hours for the installing of the electronic element can be reduced, thereby reducing the manufacturing cost and achieving a low profile for the amount of the thickness of the mount substrate.

In addition, the conventional base substrate for mounting a lens is no longer required, so that the man-hours for the manufacturing of the substrate itself and the man-hours for mounting a lens are reduced, thereby reducing the manufacturing cost and achieving a low profile for the amount of the thickness of the base substrate. In addition, a spacer for maintaining a space between base substrates for mounting a lens is no longer required, so that the man-hours for the manufacturing of the spacer itself and the man-hours for installing a spacer in the base substrate having a lens mounted thereon are reduced, thereby reducing the manufacturing cost.

In addition, the conventional base substrate is not used. Instead, a focusing lens is used, the focusing lens being precisely formed by a technique of resin molding to resin mold a lens, for example, which functions as an optical element. As a result, a spacer section (edge section) on the circumference side of the focusing lens can accurately secure a space.

That is, if the conventional base substrate and spacer are used, a total variation is created by adding a variation of the base substrate, a variation of a resin, and the variation of the spacer. As a result, a significant degree of variation is created in a height direction. On the other hand, in the present invention, the only problem would be a variation of a size of each lens plate when the lens plate is formed at once. Specifically, as described above, it is important for obtaining a clear image to accurately fix the image forming distance between the focusing lens plate and the image capturing element and precisely focusing incident light into an image on the image capturing element. This precision in the vertical direction (z direction) is significantly high.

Further, although it is desirable that a resin be a hermetically sealed resin, it is difficult to achieve a resin that is hermetically sealed, and there is a possibility for water to enter the resin. If there is no vent hole that is formed by a groove, there is a possibility of the formation of condensation due to the water that has entered inside. If there is a vent hole that is formed by a groove, an adhesive resin with air permeability can be used, thereby broadening the selection of the resin. In light of such a significance, it is possible to improve the precision of the processing as well as the quality.

In addition, if a resin adhesion layer is formed in a half-sealed state (a vent hole formed by a groove, and adhesion resin with air permeability, for example) on the circumference of each of the plurality of electronic elements of the electronic element wafer and even if water once enters the space portion of the plurality of electronic elements, such water can be controlled or prevented from forming condensation by this air pass of half-sealed state (there is a vent hole formed by a groove, for example), thereby maintaining the good quality.

Further, the precision of the processing and the quality can be finely maintained.

Further, the conventional mount substrate is no longer required, so that the manufacturing of the module in a chip size (optical element size) is possible, thereby further minimizing the installing area.

According to the present invention with the configuration described above, when a large number of modules are manufactured at once, the mount substrate for installing an electronic element, base substrate for mounting a lens, and spacer are not used as before. As a result, the man-hours for manufacturing the mount substrate, the base substrate or the spacer is reduced. Apparatus for installing an optical element on the mount substrate or for mounting a lens on the base substrate and installing a spacer as well as the man-hours relating the apparatus will no longer be required, thereby significantly reducing the man-hours for the manufacturing. In addition, because the mount substrate or base substrate is no longer required, the height of each module and further the thickness of the entire lens member can be controlled to be thin, thereby finely achieving the precision of the processing and the quality.

In addition, a conventional base substrate is not used. Instead, a focusing lens is used, the focusing lens being precisely formed by a technique of resin molding to resin mold a lens, for example, which functions as an optical element. As a result, a spacer section (edge section) on the circumference side of the focusing lens can accurately secure a space.

Further, because the present invention forms a lens at once, the only problem would be a variation of a size of each lens. As a result, this precision in the vertical direction (z direction) can be significantly high.

Further, if a resin adhesion layer is formed in a half-sealed state (a vent hole formed by a groove, and adhesion resin with air permeability, for example) on the circumference of each of the plurality of electronic element of the electronic element wafer and even if water once enters the space portion of the plurality of electronic elements, such water can be controlled or prevented from forming condensation by this air pass of half-sealed state (a vent hole formed by a groove, and adhesion resin with air permeability, for example), thereby maintaining the good quality. In such a case, the selection of the resin is broadened, and it is possible to improve the precision of the processing as well as the quality.

Further, the conventional mount substrate is no longer required, so that the manufacturing of the module in a chip size (optical element size) is possible, thereby further minimizing the installing area.

These and other advantages of the present invention will become apparent to those skilled in the art upon reading and understanding the following detailed description with reference to the accompanying figures.

BRIEF DESCRIPTION OF THE DRAWINGS

FIG. 16 is a main part cross sectional view illustrating a step of manufacturing a lens array of the present invention using a stamper.

FIG. 17 is a main part cross sectional view illustrating a step of adhering a plurality of lens array plates in FIG. 18.

Figure 1:
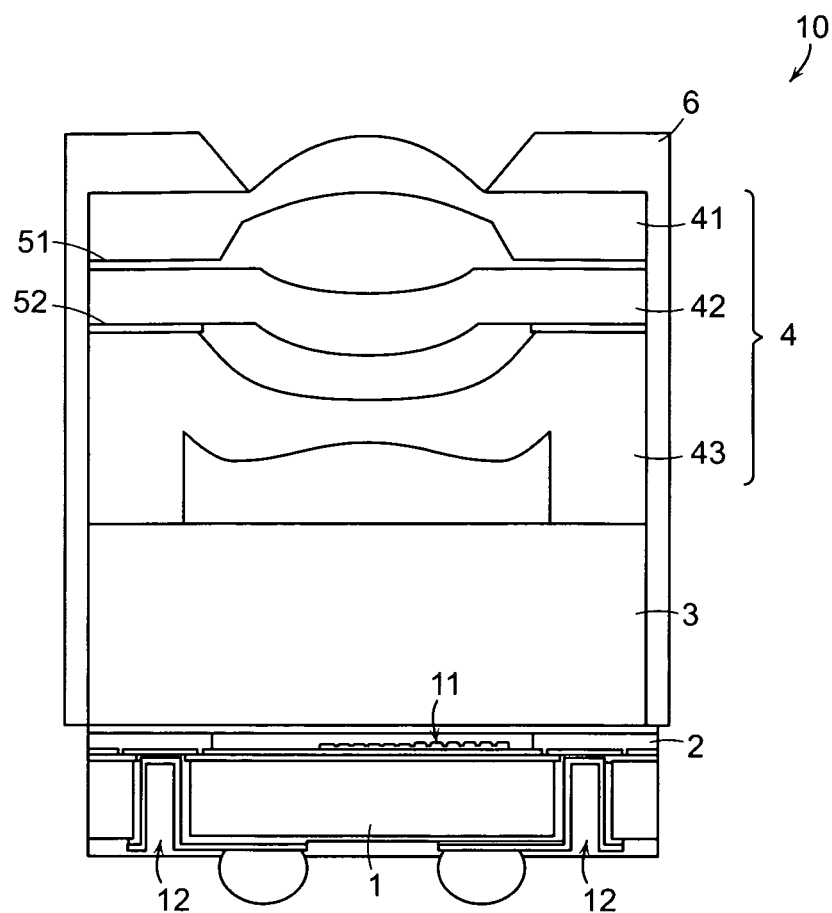
FIG. 1 is a longitudinal cross sectional view illustrating an exemplary essential structure of a sensor module according to Embodiment 1 of the present invention.

1 through hole wafer
1A, 1A' sensor wafer
2 resin adhesion layer
3 glass plate
4 lens plate
4a lens resin material
51, 52 lens adhesion layer
6 light shielding member
10 sensor module
11 image capturing element
12 through hole
12a resist film
12b insulation film
12c metal wiring material
12d metal wiring
13 pad
14 insulation film
15 wiring layer (metal wiring 12d)
16 solder resist
17 solder ball
21 groove
22 inner space
23 space area
41 focusing lens
42 diffusion lens
43 aberration correcting lens
44 center portion of a lens area
45 circumference portion as a spacer section
46 upper molding pattern
47 lower molding pattern
48f stamper original pattern
48g nickel (Ni) material
48g' Ni stamper
48h lens resin material
48i silica (solid) and/or spacerball (spacer)
48j upper pattern stamper
48k, 48m lens array plate
48n adhesion layer

DESCRIPTION OF THE PREFERRED EMBODIMENTS

Hereinafter, as Embodiment 1, an electronic element module manufactured at once by cutting an electronic element wafer module according to the present invention and a manufacturing method for the electronic element module are applied to a sensor module manufactured at once by cutting a sensor wafer module and a manufacturing method for the sensor module, and Embodiment 1 will be described in detail with reference to the accompanying figures. Subsequently, as Embodiment 2, a finished product using this electronic element module is applied to an electronic information device using the sensor module according to Embodiment 1 as an image capturing section or an electronic information device using other electronic element module in, for example, an information recording and reproducing section, and Embodiment 2 will be described in detail with reference to the accompanying figures.

(Embodiment 1)

FIG. 1 is a longitudinal cross sectional view illustrating an exemplary essential structure of a sensor module according to Embodiment 1 of the present invention.

In FIG. 1, a sensor module 10 according to Embodiment 1 is provided with an image capturing element 11 as an electronic element, on a surface of a wafer chip, the image capturing element 11 composed of a plurality of light receiving sections that are photoelectric conversion sections (photodiodes) corresponding to a plurality of pixels. The sensor module 10 further includes: a penetrating wafer 1 having a through hole wafer in which a through hole 12 is provided between the front surface and the back surface and they are electrically connected; a resin adhesion layer 2 formed on the circumference of the image capturing element 11 of the through hole wafer 1; a glass plate 3 functioning as a cover glass to cover the resin adhesion layer 2; a lens plate 4 provided on the glass plate 3, on which a plurality of lens plate 41 to 43 are laminated functioning as an optical element for focusing incident light on the image capturing element 11; lens adhesion layers 51 and 52 for adhering and fixing the lens plates 41 to 43; and a light shielding member 6 for opening the center of the lens plate 41, which is located on top of the lens plates 41 to 43, as a circular light intake and for shielding other surface portions and the side portions of the lens plates 41 to 43 and the glass plate 3. On the through hole wafer 1, the glass plate 3 and the lens plate 4 are aligned in this order and adhered top and bottom by the resin adhesion layer 2, the lens adhesion layers 51 and 52 and the like. The sensor module 10 according to Embodiment 1 is individually manufactured at once by cutting a sensor wafer module of a wafer level, in which the through hole wafer 1, the resin adhesion layer 2, the glass plate 3, the plurality of lens plates 41 to 43, and the lens adhesion layers 51 and 52 are adhered together, and subsequently attaching the light shielding member 6 to the sensor wafer module from the top.

Figure 2:
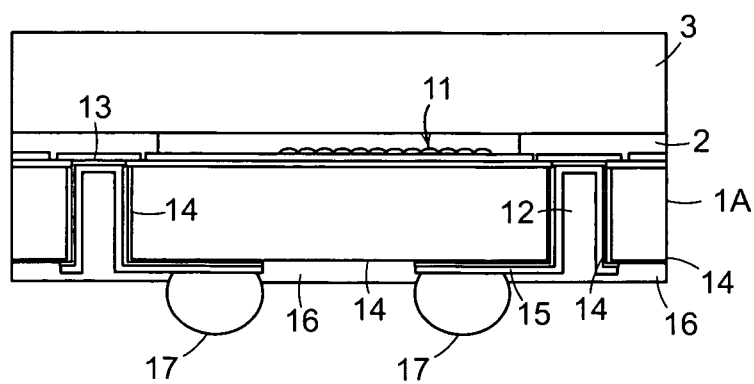
FIG. 2 is a longitudinal cross sectional view schematically illustrating an exemplary essential structure of a through hole wafer and glass plate in FIG. 1 adhered by a resin adhesion layer.

The sensor wafer module is arranged with the plurality of image capturing elements 11 (a plurality of light receiving sections, which constitute a plurality of pixels, are provided for each image capturing element) in a matrix on the front surface side of a sensor wafer 1A provided with the plurality of through hole wafer 1 prior to cutting. The thickness of the through hole wafer 1 ranges from 100 to 200 µm. As illustrated in FIG. 2, a plurality of through holes 12 are provided penetrating from the back surface of the through hole wafer 1 to the front surface below a pad 13. The side wall and the back surface side of the through hole 12 are covered with an insulation film 14, a wiring layer 15, which has a contact with the pad 13, is formed via the through hole 12 to the back surface. A solder resist 16 is formed on the wiring layer 15 and the back surface of the through hole 1. In regard to the portion where a solder ball is formed on the wiring layer 15, the solder resist 16 is opened and the solder ball is formed in such a manner to be exposed outside. Each layer can be formed by a technique, such as photolithography, etching, gilding, CVD method, that is used for a common semiconductor process. Subsequent to the cutting of the wafer, a sensor substrate (sensor chip section as an electronic element chip section) is configured as the through hole wafer 1, the sensor substrate having an element area.

Figure 3:
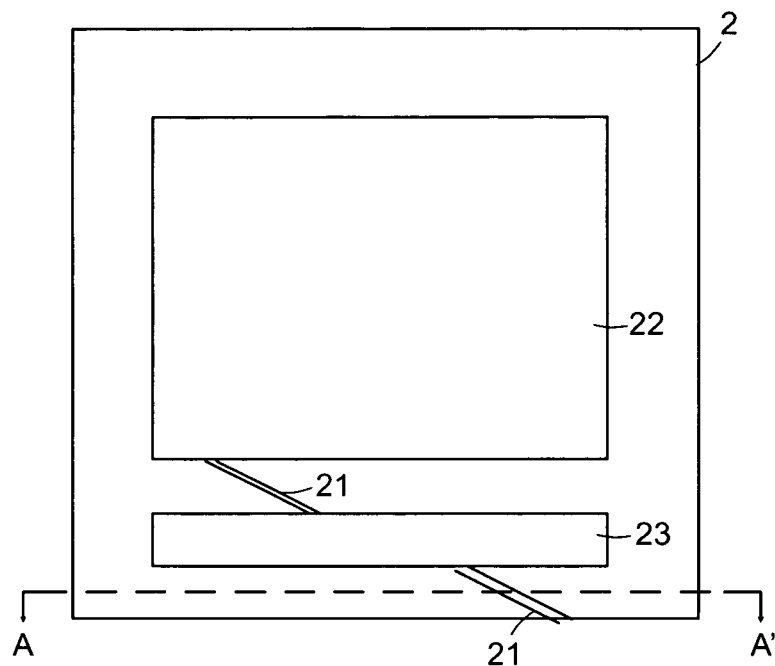
FIG. 3 is a plan view schematically illustrating a resin adhesion layer positioned on each surface of an image capturing element of the through hole wafer in FIG. 1.
Figure 4:
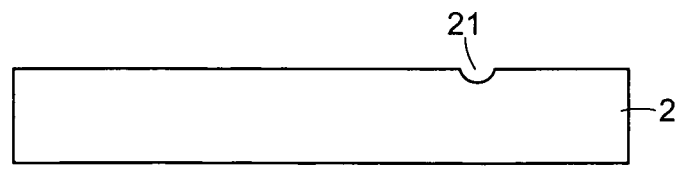
FIG. 4 is a longitudinal cross sectional view along the line A-A' of the resin adhesion layer in FIG. 3.

The resin adhesion layer 2 is formed on a predetermined position on the through hole wafer 1 by a common photolithography technique, and the glass plate 3 is adhered on the resin adhesion layer 2. Without limitation to this, the resin adhesion layer 2 can be formed by a screen printing method or dispense method, other than the photolithography technique. The resin adhesion layer 2 has a shallow groove 21 (air pass) formed on a portion of a surface on the side where the glass plate 3 is fixed, as illustrated in FIG. 3 and FIG. 4. The groove 21 can be formed by the photolithography technique simultaneously when the resin adhesion layer 2 is formed. The thickness of the resin ranges approximately from 30 µm to 300 µm, and the depth of the groove 21 ranges approximately from 3 µm to 20 µm. The groove 21 is used to prevent the formation of condensation in an inner space 22 when the surface of a semiconductor is covered by the glass plate 3 and the inner space 22 of a sensor area, in which the image capturing element 11 functioning as an electronic element on the through hole wafer 1 is provided, is sealed. The groove 21 also has a structure of an accumulation space area 23 (storing space area) in the middle of the groove so that cutting water, slurry and the like will be difficult to enter the inner space 22 of the sensor area and adhere to the surface of a sensor when the sensor wafer module is diced into each module. The groove 21 (air pass) for forming the space areas 22 and 23 in a half-sealed state is formed in a straight line, an S shape, a maze shape (herein, the groove is a diagonal straight line), or in any combination thereof, so as to provide a certain distance.

Further, the resin adhesion layer 2 has not only a groove 21 formed therein for connecting the space area 22 above each of the plurality of image capturing elements 11 to the outside, but also a groove 21 formed therein for connecting the space area 22 and the outside via another space area 23 connected by the groove 21. In addition, the resin adhesion layer 2 is positioned for each image capturing element 11, and is also positioned in an area other than the area of the image capturing element 11 as well as an area other than a dicing area between adjacent image capturing elements 11. Without limitation to the groove 21 of the resin adhesion layer 2, another air pass may be provided. Alternatively, the configuration may be provided with a material that is connectable with the inside (material having a rough material particle or material which water can pass through between the outside and the inside).

Figure 5:
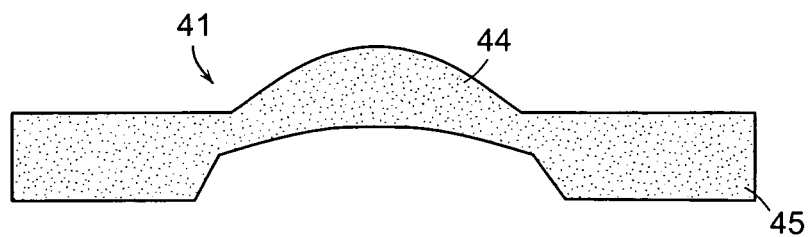
FIG. 5 is a longitudinal cross sectional view schematically illustrating a unit structure of a lens plate in FIG. 1.
Figure 6:
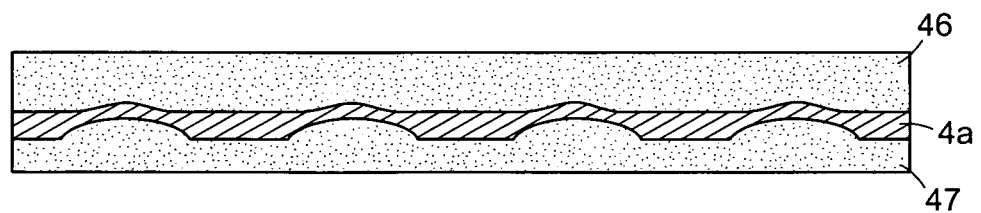
FIG. 6 is a longitudinal cross sectional view schematically illustrating a state of a molding pattern at the time of molding a resin adhesion layer.

The lens plate 4 is a transparent resin lens plate. For example, as illustrated in FIG. 5, the lens plate 41 is configured with a center portion 44, which is a lens area having a lens function, and a circumference portion 45, which is a spacer portion having a spacer function. The entire lens plate is formed of the same resin material. As illustrated in FIG. 6, the method for forming the lens plate 41 includes inserting a lens resin material 4a between an upper molding pattern 46 and a lower molding pattern 47, accurately controlling the distance between the molding patterns so as to form a predetermined thickness, curing the lens resin by a method such as ultraviolet (UV) curing and thermal curing, and further performing a thermal process to relieve the inner stress and stabilize the lens shape. As a result, the resin lens plates 41 to 43 can be formed with a predetermined lens shape and a predetermined lens thickness.

The upper molding pattern 46 and lower molding pattern 47 can be glass or metal. The structure according to Embodiment 1 is formed with the lens plates 41 to 43 adhered together. For adhering the lens plates, the adhesion members 51 and 52 are used. The adhesion members 51 and 52 may have a light shielding function.

The lens plate 4 formed with plural pieces of optical elements is composed of an aberration correcting lens 43, diffusion lens 42, and a focusing lens 41 (when only one lens is provided, it is a focusing lens). The lens plate 4 is provided with a lens area in the center portion 44, and a circumference portion 45 is provided on the circumference side of the lens area, the circumference portion 45 functioning as a spacer section having a predetermined thickness. The spacer sections having a predetermined thickness that are provided for respective circumference side of the lens plate 4 are laminated in this order from the lower side. The spacer sections have a position determining function, and the position determining function is constituted with a concave portion and a convex portion with a taper or an alignment mark. The adhesion layer 51 and/or adhesion layer 52, which adhere the lens plate 4 that includes three lenses, may also have a light shielding function. The adhesion layers 51 and 52 may include a solid-body that determines a space.

Herein, a method for manufacturing a sensor module 10 will be described to manufacture the sensor module 10 with the structure described above.

Figure 7:
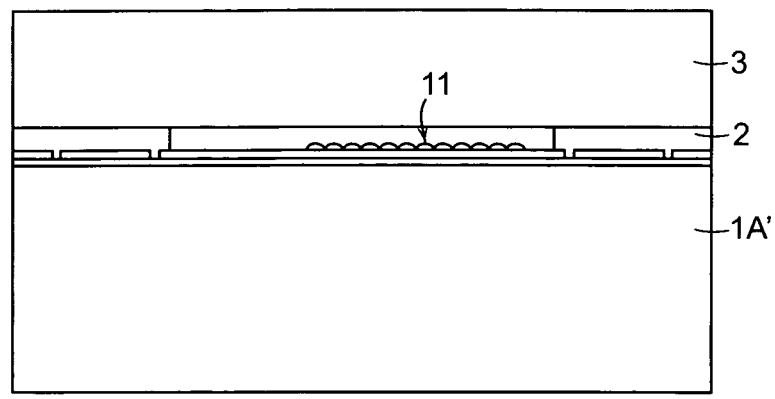
FIG. 7 is a main part cross sectional view illustrating a step of adhering a glass plate where a glass plate is adhered to the through hole wafer in FIG. 2 by a resin adhesion layer.
Figure 8:
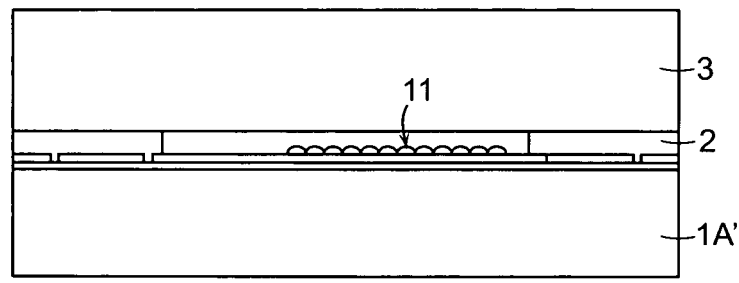
FIG. 8 is a main part cross sectional view illustrating a step of polishing where the through hole wafer in FIG. 2 is polished from its back surface.
Figure 9:
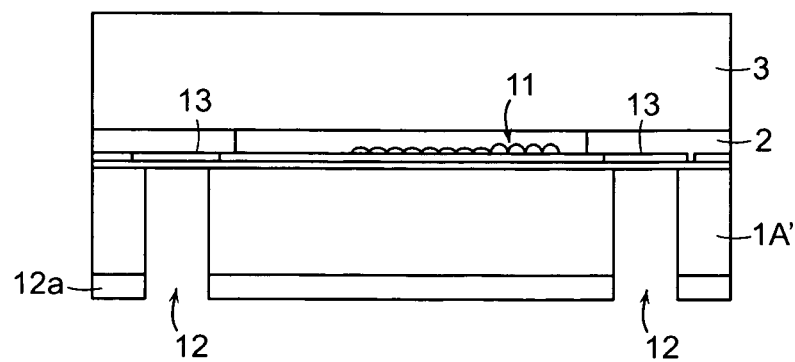
FIG. 9 is a main part cross sectional view illustrating a first step of forming a through hole in the back surface of the through hole wafer in FIG. 2.
Figure 10:
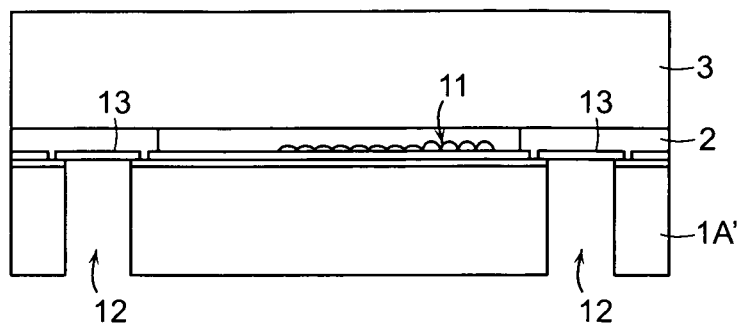
FIG. 10 is a main part cross sectional view illustrating a second step of forming a through hole in the back surface of the through hole wafer in FIG. 2.
Figure 11:
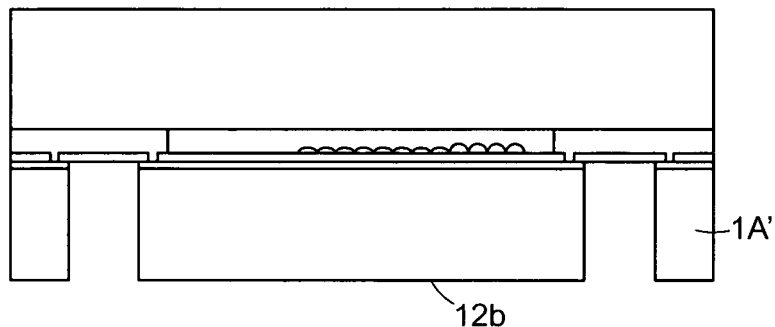
FIG. 11 is a main part cross sectional view illustrating a step of forming an insulation film in the back surface of the through hole wafer in FIG. 2.
Figure 12:
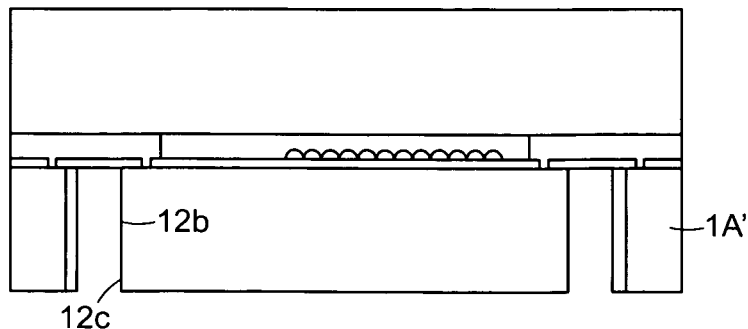
FIG. 12 is a main part cross sectional view illustrating a step of laminating a metal wiring material on the back surface of the through hole wafer in FIG. 2.
Figure 13:
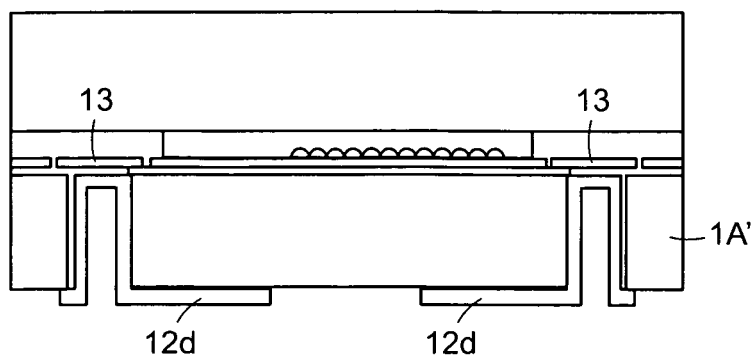
FIG. 13 is a main part cross sectional view illustrating a step of forming a metal wiring in the back surface of the through hole wafer in FIG. 2.
Figure 14:
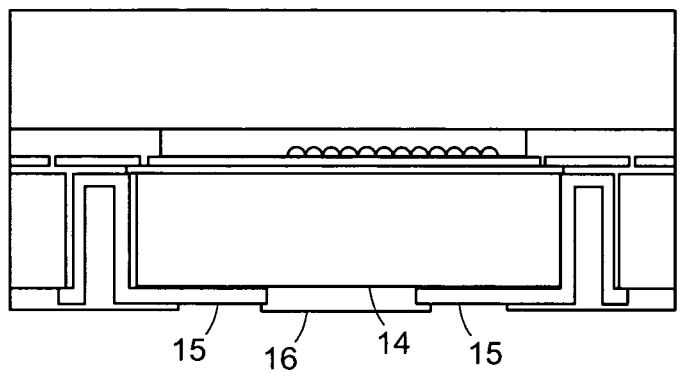
FIG. 14 is a main part cross sectional view illustrating a step of forming a solder resist in the back surface of the through hole wafer in FIG. 2.
Figure 15:
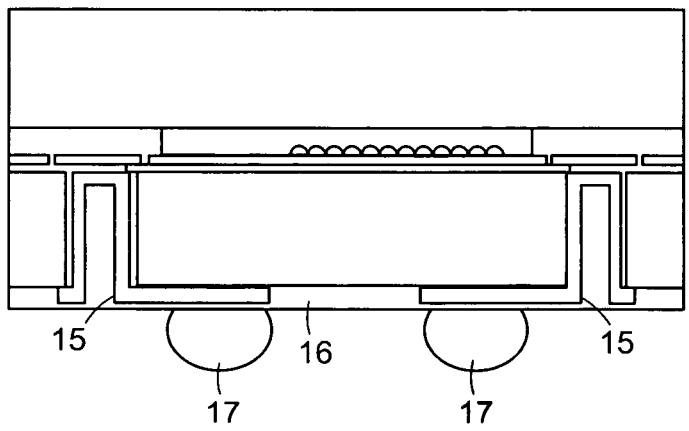
FIG. 15 is a main part cross sectional view illustrating a step of forming a solder ball in the back surface of the through hole wafer in FIG. 2.

The method for manufacturing the sensor module 10 includes: a step of forming the resin adhesion layer 2 on the circumference of each image capturing element 11 of the sensor wafer 1A having the plurality of image capturing elements 11 and further adhering the glass plate 3, which is a cover glass, on the resin adhesion layer 2 (FIG. 7); a step of polishing the back side of the sensor wafer 1A to a thin layer so as to form a thin sensor wafer 1A' having a predetermined thickness (FIG. 8); a step of forming the plurality of through holes 12 penetrating from the back surface of the sensor wafer 1A to the back of the pad 13 on the surface, for each sensor chip section (cut through hole wafer 1) by etching using a resist film 12a as a mask (FIG. 9 and FIG. 10); a step of providing an insulation film 12b on the back surface of the sensor wafer 1A' (FIG. 11), forming a film of a metal wiring material 12c on the insulation film 12b, and forming a metal wiring 12d on the back surface of the sensor wafer 1A' going by way of the pad 13 to the through hole 12 (FIG. 12 and FIG. 13); a step of forming the solder resist 16 on the wiring layer 15, which is the metal wiring 12d, and on the back surface of the wafer and opening a portion for forming a solder ball of the solder resist 16 (FIG. 14); a step of forming a solder ball 17 on the wiring layer 15 (FIG. 15); a step of adhering the lens plate 4 constituting one or plurality of resin lenses on the surface of the glass plate 3 using the spacer sections on the circumference side of the lens areas; a step of cutting at once the laminated sensor wafer 1A', glass plate 3 and lens plate 4 for one or plurality of sensor chip section (through hole wafer 1); and a step of forming the light shielding member 6 on at least a cut section (FIG. 1).

Herein, the description will be from the manufacturing of a sheet-formed lens array plate, which is formed by coupling in an array a plurality of lenses having a spacer section (edge section) on the circumference side of the lens area, to the manufacturing of the sensor module 10 for each chip, by dividing the description in detail into the steps of (1) to (5).

(1) Step of Forming Ni Stamper (Step S1)

First, as a method for manufacturing an original pattern of a stamper, a plurality of patterns are cut and processed precisely on a glass or metal plate.

Electro plating with nickel (Ni) material 48g is performed on a stamper original pattern 48f and the surface of the stamper original pattern 48f is transferred by electroforming. As a metal lens pattern with fine demolding, an Ni stamper 48g' (lens shape) is formed. The measure of the essential portion of the stamper is measured for inspection, and a simulation is performed to prevent poor functioning to the measure and the feedback is given to the stamper forming step.

(2) Step of Forming a Lens Array Plate (Step S2)

Next, as illustrated in FIG. 16, the stamper 48g' is used as a lower pattern stamper 48g' and a lens resin material 48h is applied to the lower pattern stamper 48g'. Silica (nano-silica) is included in the lens resin material 48h as a filler with no deterioration in transmissivity so as to maintain the lens shape. Using a double side pressing apparatus (not shown), an upper pattern stamper 48J, which is manufactured in a similar manner to the lower pattern stamper 48g', holds the lens resin material 48h applied to the lower pattern stamper 48g' so as to control the thickness of the lens film with high precision. Further, using the double side pressing apparatus, the upper pattern stamper 48j and the lower pattern stamper 48g' are separated from each other so as to demold and remove a lens array plate 48k, which includes coupled lenses of resin. Thermal annealing is performed to the removed lens array 48k to soften the inner stress, and a lens array plate 48k is formed. The measure of the essential portion of the lens array plate 48k is measured for inspection, and a simulation for measurement is performed to prevent poor functioning to the measure (e.g., shrinkage) based on data on the amount of shrinkage of the lens array plate 48k. Then, the feedback is given to an optical design system for the step of forming a master mold, so that the design and measure of a master mold 48a can be correctable.

(3) Step of Forming a Lens Array Plate (Step S3)

Further, as illustrated in FIG. 17, a plurality of types of lens arrays integrated with a plurality of lenses made only of molded lens resin, namely the lens array plate 48k and a lens array plate 48m are aligned and adhered to each other. Herein, a solid silica and/or spacer ball 48i, which functions as a spacer, performs to evenly maintain the resin space of an adhesion layer 48n.

(4) Step of Constructing (Step S4)

A combined lens member is formed by adhering a plurality of types of lens array plates (a plate formed by connecting a plurality of lenses having edge section in a sheet form), such as the lens array plate 48k and the lens array plate 48m, and the combined lens member is aligned and adhered on the glass plate 3 in a manner to correspond to each center of the image capturing elements 11. As a result, the electronic element wafer module of a wafer level is formed.

Herein, the adhesion resin layer 2 is adhered on a predetermined position of the glass plate 3 in advance by screen printing. In addition, the positioning in X and Y directions of the combined lens member on the glass plate 3 is determined precisely by a conveyor that conveys the combined lens member on the glass plate 3 with a predetermined alignment mark as a reference, and the combined lens member can be equipped on the glass plate 3.

(5) Step of Cutting (Step S5)

The silicon constituting the through hole wafer 1 (sensor wafer 1A), glass material of the glass plate 3, and lens resin material of the combined lens member, all of which are laminated and integrated as an electronic element wafer module of a wafer level, are cut all together by a wire or laser irradiation.

According to Embodiment 1 with the structure described above, the conventional mount substrate, base substrate or spacer is no longer required. Therefore, the man-hours for manufacturing them as well as the man-hours for installing the elements and inserting the spacer are reduced. Further, the height of each module is reduced and fine precision and quality can be provided.

(Embodiment 2)

Figure 18:
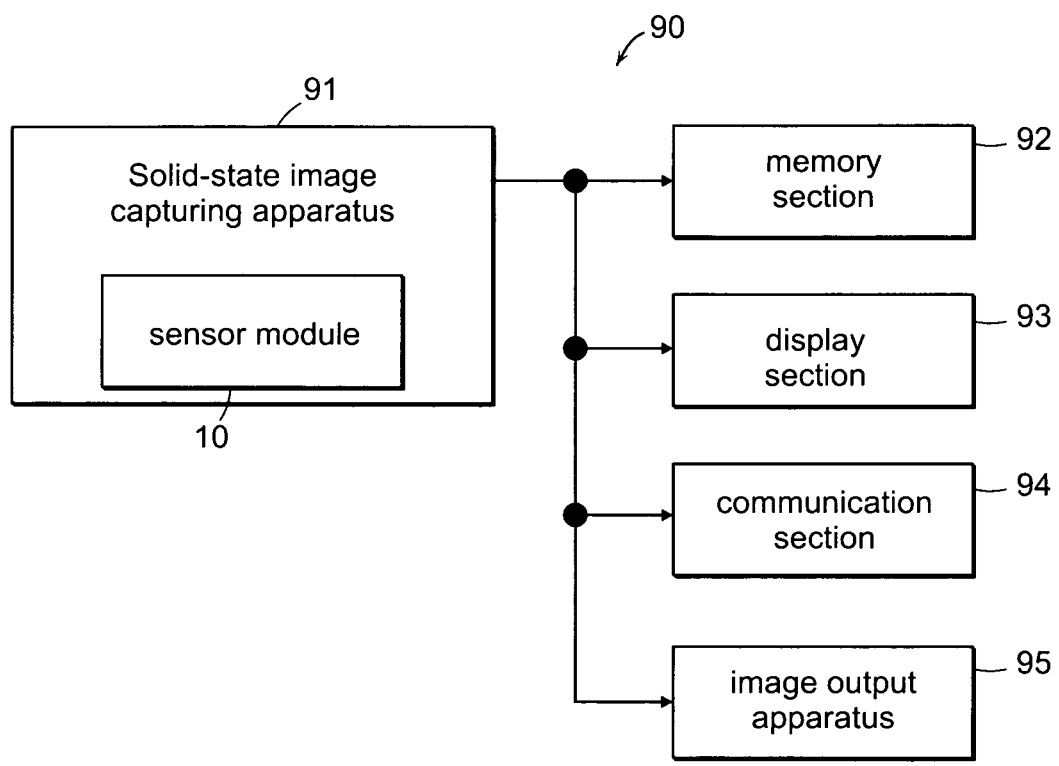
FIG. 18 is a block diagram illustrating an exemplary diagrammatic structure of an electronic information device of Embodiment 2 of the present invention, using a solid-state image capturing apparatus including the sensor module according to Embodiment 1 of the present invention in an image capturing section.
Figure 19:
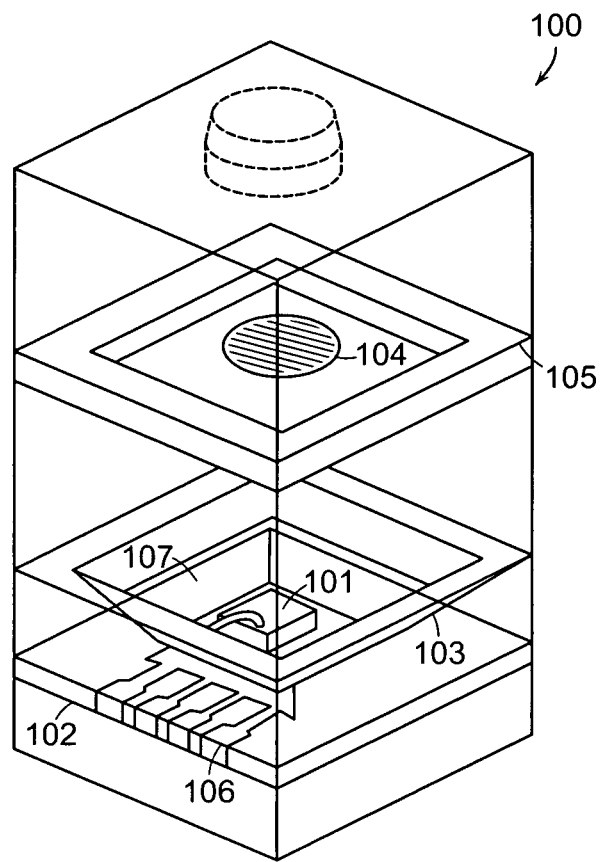
FIG. 19 is a main part cross sectional view schematically illustrating a conventional optical apparatus disclosed in US patent Reference 1.
Figure 20:
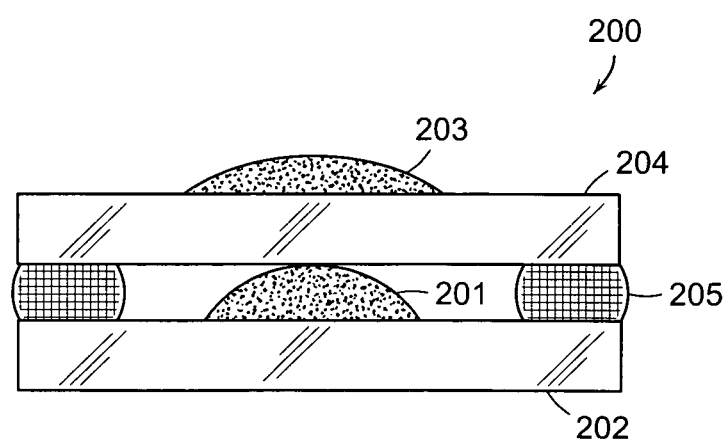
FIG. 20 is a cross sectional structural view of a conventional lens wafer disclosed in US patent Reference 2.
Figure 21:
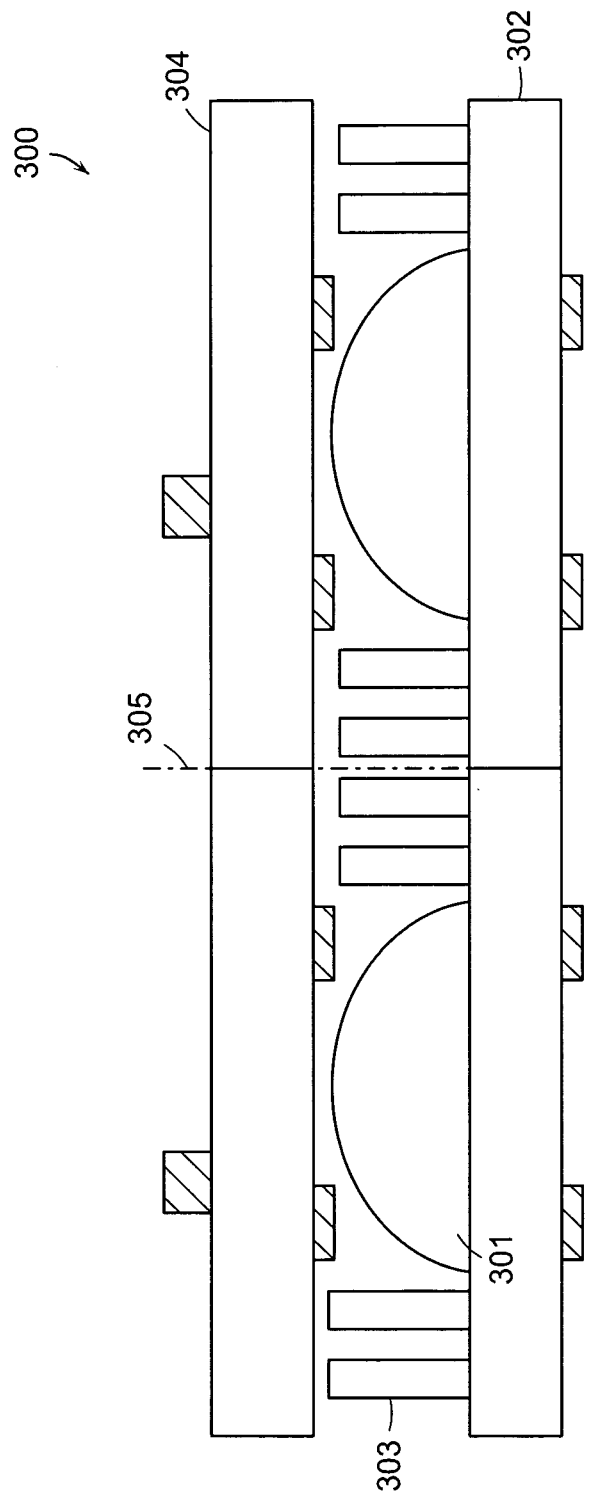
FIG. 21 is a cross sectional structural view of a conventional lens wafer disclosed in US patent Reference 3.

FIG. 18 is a block diagram illustrating an exemplary diagrammatic structure of an electronic information device of Embodiment 2 of the present invention, using a solid-state image capturing apparatus including the sensor module according to Embodiment 1 of the present invention in an image capturing section.

In FIG. 18, the electronic information device 90 according to Embodiment 2 of the present invention includes: a solid-state image capturing apparatus 91 for performing various signal processing on an image capturing signal from the sensor module 10 according to Embodiment 1 so as to obtain a color image signal; a memory section 92 (e.g., recording media) for data-recording a color image signal from the solid-state image capturing apparatus 91 after a predetermined signal process is performed on the image signal for recording; a display section 93 (e.g., a color liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the image signal for communication; and an image output apparatus 95 for printing the color image signal from the solid-state image capturing apparatus 91 after predetermined signal processing is performed for printing. Thus, the electronic information device 90 according to Embodiment 2 may include all of the memory section 92, the display section 93, the communication section 94, and the image output apparatus 95. Without any limitations to this, the electronic information device may include at least any of these sections.

As the electronic information device 90, an electronic information device that has an image input device is conceivable, such as a digital camera (e.g., digital video camera and digital still camera), an image input camera (e.g., a monitoring camera, a door phone camera, a camera equipped in a vehicle, and a television camera), a scanner, a facsimile machine and a camera-equipped cell phone device.

Therefore, according to Embodiment 2 of the present invention, the color image signal from the solid-state image capturing apparatus 91 can be: displayed on a display screen finely by the display section 93, printed out on a sheet of paper using an image output apparatus 95, communicated finely as communication data via a wire or a radio by the communication section 94; stored finely at the memory section 92 by performing predetermined data compression processing; and various data processes can be finely performed.

In addition, without the limitation to the electronic information device 90 according to Embodiment 2 described above, the electronic information device may be, for example, a pickup apparatus using the electronic element module of the present invention in an information recording and reproducing section. In such a case, an optical element of the pickup apparatus is an optical function element (e.g., a hologram optical element) for advancing and emitting output light straight, and for bending and guiding incident light in a predetermined direction. In addition, an electronic element of the pickup apparatus has an emission element (e.g., semiconductor laser element or laser chip) for generating outgoing light, and a light receiving element (e.g., photo IC) for receiving incident light.

Although not described in Embodiment 1 described above, IR (Infra-Red) coating or AR (Anti-Reflection) coating may be provided on the surface of the glass plate 3 functioning as a transparent cover member. An IR coating film is a coating film that reflects infra-red. An AR coating film is a reflection preventing film.

As described above, the present invention is exemplified by the use of its preferred Embodiments 1 to 2. However, the present invention should not be interpreted solely based on Embodiments 1 to 2 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 2 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of an electronic element wafer module, an electronic wafer module, a sensor wafer module, a sensor module and a manufacturing method of the sensor module, a lens array plate, and an electronic information device. The electronic element wafer module is formed by modularizing (integrating) a plurality of lenses for focusing incident light and an image capturing element that corresponds to each lens and has a plurality of light receiving sections for performing photoelectric conversions on and capturing image light from a subject, or by modularizing (integrating) a plurality of optical function elements for advancing outgoing light straight, and bending and guiding incident light in a predetermined direction, with an emission element for corresponding to each optical function element and generating outgoing light, and a light receiving element for receiving incident light. The electronic element module is manufactured by cutting the electronic element wafer module. The sensor wafer module is formed by modularizing (integrating) the image capturing element having a plurality of light receiving sections for performing photoelectric conversions on and capturing image light from a subject, and a lens for forming incident light into an image on an image capturing element. The sensor module is formed by cutting the sensor wafer module. The lens array plate is used for the sensor module. The electronic information device includes, for example, a digital camera (e.g., digital video camera and digital still camera), an image input camera (e.g., car-mounted camera), a scanner, a facsimile machine, a camera-equipped cell phone device, and a personal digital assistant (PDA) having the sensor module as an image input device used in an image capturing section, or a pickup apparatus using the electronic element module in an information recording and reproducing section. According to the present invention, when a large number of modules are manufactured at once, the mount substrate for installing an electronic element, base substrate for mounting a lens, and spacer are not used as before. As a result, the man-hours for manufacturing the mount substrate, the base substrate or the spacer is reduced. Apparatus for installing an optical element on the mount substrate or for mounting a lens on the base substrate and installing a spacer as well as the man-hours relating the apparatus will no longer be required, thereby significantly reducing the man-hours for the manufacturing. In addition, because the mount substrate or base substrate is no longer required, the height of each module and further the thickness of the entire lens member can be controlled to be thin, thereby finely achieving the precision of the processing and the quality.

In addition, a conventional base substrate is not used. Instead, a focusing lens is used, the focusing lens being precisely formed by a technique of resin molding to resin mold a lens, for example, which functions as an optical element. As a result, a spacer section (edge section) on the circumference side of the focusing lens can accurately secure a space.

Further, because the present invention forms a lens at once, the only problem would be a variation of a size of each lens. As a result, this precision in the vertical direction (z direction) can be significantly high.

Further, if a resin adhesion layer is formed in a half-sealed state (a vent hole formed by a groove, and adhesion resin with air permeability, for example) on the circumference of each of the plurality of electronic elements of the electronic element wafer and even if water once enters the space portion of the plurality of electronic elements, such water can be controlled or prevented from forming condensation by this air pass of half-sealed state (a vent hole formed by a groove, and adhesion resin with air permeability, for example), thereby maintaining the good quality. In such a case, it is possible to improve the precision of the processing as well as the quality.

Further, the conventional mount substrate is no longer required, so that the manufacturing of the module in a chip size (optical element size) is possible, thereby further minimizing the installation area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electronic element wafer module, comprising:
   an electronic element wafer arranged with a plurality of electronic elements having a through hole electrode;
   a resin adhesion layer formed of resin in a predetermined area on the electronic element wafer;
   a transparent cover member covering the electronic element wafer and fixed on the resin adhesion layer; and
   a plurality of resin optical elements adhered and fixed on the transparent cover member to be integrated in such a manner to correspond to the respective plurality of electronic elements.

2. An electronic element wafer module according to claim 1, wherein the plurality of optical elements are integrated to be configured.

3. An electronic element wafer module according to claim 1, wherein the plurality of optical elements are laminated with adhesion layers interposed in between the optical elements on the circumference side of the center portion in a plan view.

4. An electronic element wafer module according to claim 1, wherein the adhesion layer for adhering the optical element also has a light shielding function.

5. An electronic element wafer module according to claim 1, wherein a solid for determining a space is included in the adhesion layer for adhering the optical element.

6. An electronic element wafer module according to claim 1, wherein the optical element is composed of one or more lenses.

7. An electronic element wafer module according to claim 6, wherein the lens is provided with a lens area at the center portion and provided with a spacer section having a predetermined thickness on the circumference side of the lens area.

8. An electronic element wafer module according to claim 7, wherein the spacer section has a position determining function.

9. An electronic element wafer module according to claim 8, wherein the position determining function of the spacer section is constituted with a concave portion and a convex portion with a taper or an alignment mark.

10. An electronic element wafer module according to claim 6, wherein the lens is a focusing lens.

11. An electronic element wafer module according to claim 1, wherein the lens is an aberration correcting lens, diffusion lens and a focusing lens, and a spacer section having a predetermined thickness and provided on the circumference side of each of the lenses is laminated in this order of aberration correcting lens, diffusion lens and a focusing lens.

12. An electronic element wafer module according to claim 1, wherein the optical element is an optical function element for advancing outgoing light straight, and bending incident light to allow for entering in a predetermined direction.

13. An electronic information device using an electronic element module cut from the electronic element wafer module according to claim 12, in an information recording and reproducing section.

14. An electronic element wafer module according to claim 1, wherein the resin adhesion layer has a groove formed to communicate with the space portion above each of the plurality of electronic elements to the outside.

15. An electronic element wafer module according to claim 14, wherein the groove is formed in a diagonal straight line, an S shape or a maze shape in relation to an edge direction of a quadrilateral of the resin adhesion layer in a plan view.

16. An electronic element wafer module according to claim 1, wherein the resin adhesion layer has a groove formed to communicate with the outside via another space portion communicating with the space portion above each of the plurality of electronic elements by a groove.

17. An electronic element wafer module according to claim 16, wherein the groove is formed in a diagonal straight line, an S shape or a maze shape in relation to an edge direction of a quadrilateral of the resin adhesion layer in a plan view.

18. A sensor module cut into individual or multiple groupings from the sensor wafer module according to claim 16.

19. An electronic element wafer module according to claim 1, wherein the resin adhesion layer is positioned for each of the plurality of electronic elements and is also positioned in an area other than the area of the electronic element as well as an area other than a dicing area between adjacent electronic elements.

20. An electronic element wafer module according to claim 1, wherein the resin adhesion layer has a material configuration that is materialistically communicable to the inside.

21. An electronic element wafer module according to claim 1, wherein the transparent cover member is a transparent resin plate or a glass plate.

22. An electronic element wafer module according to claim 1 wherein the transparent cover member is provided with IR (Infra-Red) coating or AR (Anti-Reflection) coating on the surface.

23. An electronic element wafer module according to claim 1, wherein the electronic element has an image capturing element having a plurality of light receiving sections for performing photoelectric conversions on and capturing image light from a subject.

24. An electronic element wafer module according to claim 1, wherein the electronic element has an emission element for generating outgoing light, and a light receiving element for receiving incident light.

25. An electronic element module cut into individual or multiple groupings from the electronic element wafer module according to claim 1.

26. An electronic element module according to claim 25, wherein a cut side of the electronic element module either has a light shielding function or is provided with a light shielding function.

27. An electronic element wafer module, comprising:
- an electronic element wafer arranged with a plurality of electronic elements having a through hole electrode;
- a resin adhesion layer formed of resin in a half-sealed state on the circumference of each of the plurality of electronic element of the electronic element wafer;
- a transparent cover member covering the electronic element wafer and fixed on the resin adhesion layer; and
- a plurality of optical elements mounted to be adhered and fixed on the transparent cover member in such a manner to correspond to the respective plurality of electronic elements.

28. An electronic element wafer module according to claim 27, wherein the plurality of optical elements are integrated to be configured.

29. An electronic element wafer module according to claim 27, wherein the plurality of optical elements are laminated with adhesion layers interposed in between the optical elements on the circumference side of the center portion in a plan view.

30. An electronic element wafer module according to claim 27, wherein the adhesion layer for adhering the optical element also has a light shielding function.

31. An electronic element wafer module according to claim 27, wherein a solid for determining a space is included in the adhesion layer for adhering the optical element.

32. An electronic element wafer module according to claim 27, wherein the optical element is composed of one or more lenses.

33. An electronic element wafer module according to claim 32, wherein the lens is provided with a lens area at the center portion and provided with a spacer section having a predetermined thickness on the circumference side of the lens area.

34. An electronic element wafer module according to claim 33, wherein the spacer section has a position determining function.

35. An electronic element wafer module according to claim 34, wherein the position determining function of the spacer section is constituted with a concave portion and a convex portion with a taper or an alignment mark.

36. An electronic information device using an electronic according to claim 35, as a sensor module in an image capturing section.

37. An electronic element wafer module according to claim 32, wherein the lens is a focusing lens.

38. An electronic element wafer module according to claim 27, wherein the lens is an aberration correcting lens, diffusion lens and a focusing lens, and a spacer section having a predetermined thickness and provided on the circumference side of each of the lenses is laminated in this order of aberration correcting lens, diffusion lens and a focusing lens.

39. An electronic element wafer module according to claim 27, wherein the optical element is an optical function element for advancing outgoing light straight, and bending incident light to allow for entering in a predetermined direction.

40. An electronic element wafer module according to claim 27, wherein the resin adhesion layer has a groove formed to communicate with the space portion above each of the plurality of electronic elements to the outside.

41. An electronic element wafer module according to claim 40, wherein the groove is formed in a diagonal straight line, an S shape or a maze shape in relation to an edge direction of a quadrilateral of the resin adhesion layer in a plan view.

42. A sensor module cut into individual or multiple groupings from the sensor wafer module according to claim 40.

43. An electronic element wafer module according to claim 27, wherein the resin adhesion layer has a groove formed to communicate with the outside via another space portion communicating with the space portion above each of the plurality of electronic elements by a groove.

44. An electronic element wafer module according to claim 43, wherein the groove is formed in a diagonal straight line, an S shape or a maze shape in relation to an edge direction of a quadrilateral of the resin adhesion layer in a plan view.

45. An electronic element wafer module according to claim 27, wherein the resin adhesion layer is positioned for each of the plurality of electronic elements and is also positioned in an area other than the area of the electronic element as well as an area other than a dicing area between adjacent electronic elements.

46. An electronic element wafer module according to claim 27, wherein the resin adhesion layer has a material configuration that is materialistically communicable to the inside.

47. An electronic element wafer module according to claim 27, wherein the transparent cover member is a transparent resin plate or a glass plate.

48. An electronic element wafer module according to claim 27 wherein the transparent cover member is provided with IR (Infra-Red) coating or AR (Anti-Reflection) coating on the surface.

49. An electronic element wafer module according to claim 27, wherein the electronic element has an image capturing element having a plurality of light receiving sections for performing photoelectric conversions on and capturing image light from a subject.

50. An electronic element wafer module according to claim 27, wherein the electronic element has an emission element for generating outgoing light, and a light receiving element for receiving incident light.

51. An electronic element module cut into individual or multiple groupings from the electronic element wafer module according to claim 27.

52. An electronic element module according to claim 51, wherein a cut side of the electronic element module either has a light shielding function or is provided with a light shielding function.

53. A sensor wafer module, comprising:
- a sensor wafer arranged with a plurality of sensor chip sections having a through hole electrode;
- a resin adhesion layer formed of resin in a predetermined area on the sensor wafer;
- a transparent cover member covering the sensor wafer and fixed on the resin adhesion layer; and
- a plurality of resin focusing lens array plates mounted to be adhered and fixed on the transparent cover member in such a manner to correspond to the respective plurality of image capturing elements,
- wherein each of the plurality of sensor chip sections is provided with an image capturing element having a plurality of light receiving sections for performing photoelectric conversions on and capturing image light from a subject.

54. A sensor wafer module, comprising:
- a sensor wafer arranged with a plurality of sensor chip sections having a through hole electrode;
- a resin adhesion layer formed of resin in a half-sealed state on the circumference of each of the plurality of electronic elements of the sensor wafer;
- a transparent cover member covering the sensor wafer and fixed on the resin adhesion layer; and
- a plurality of focusing lenses mounted to be adhered and fixed on the transparent cover member in such a manner to correspond to the respective plurality of electronic elements, wherein the sensor chip section is provided with an image capturing element having a plurality of light receiving sections for performing photoelectric conversions on and capturing image light from a subject, as the electronic element.

55. A method for manufacturing a sensor module, comprising the steps of:
- forming a resin adhesion layer on each circumference of a plurality of image capturing elements arranged with a plurality of sensor chips;
- adhering a cover glass on the resin adhesion layer;
- thinning a back side of the sensor wafer;
- forming a plurality of through holes penetrating from a back surface to a front surface of the sensor wafer reaching up to a back surface of a pad, for each sensor chip;
- forming a wiring on the back surface of the sensor wafer via the through hole;
- adhering one or more resin lens plates on the surface of the cover glass at a spacer section on the circumference side of a lens area of each resin lens plate;
- cutting the sensor wafer, the cover glass, and the lens at once for one or more sensor chip sections; and
- forming a light shielding layer on at least a cut section.

56. A method for manufacturing a sensor module according to claim 55, wherein the step of cutting uses laser or a wire saw.

57. A method for manufacturing a sensor module, comprising the steps of:
- forming a resin adhesion layer in a half-sealed state on each circumference of a plurality of image capturing elements of a sensor wafer arranged with a plurality of sensor chip sections;
- adhering a cover glass on the resin adhesion layer;
- thinning a back side of the sensor wafer;
- forming a plurality of through holes penetrating from a back surface to a front surface of the sensor wafer reaching up to a back surface of a pad, for each sensor chip section;
- forming a wiring on the back surface of the sensor wafer via the through hole;
- adhering one or more lens plates on the surface of the cover glass;
- cutting the sensor wafer, the cover glass, and the lens at once for one or more sensor chip sections; and
- forming a light shielding layer on at least a cut section.

58. A method for manufacturing a sensor module according to claim 57, wherein the step of cutting uses laser or a wire saw.

* * * * *